(12) United States Patent
Servaes

(10) Patent No.: US 6,204,730 B1
(45) Date of Patent: Mar. 20, 2001

(54) POWER AMPLIFIER ARRANGEMENT

(75) Inventor: Jan Servaes, Waregem (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/466,789

(22) Filed: Dec. 20, 1999

(30) Foreign Application Priority Data

Jan. 28, 1999 (EP) .................................................. 99400201

(51) Int. Cl.$^7$ .................................................. H03F 3/217
(52) U.S. Cl. ........................ 330/251; 330/207 A; 330/310
(58) Field of Search ................................ 330/207 A, 251, 330/263, 67, 310, 311; 363/96

(56) References Cited

U.S. PATENT DOCUMENTS

| | | |
|---|---|---|
| 4,100,501 | 7/1978 | Nakagaki et al. .................... 330/263 |
| 4,347,481 | * 8/1982 | Yoshida ............................. 330/207 A |
| 5,387,876 | * 2/1995 | Sondermeyer ....................... 330/267 |
| 5,525,931 | * 6/1996 | Mills .................................... 330/263 |
| 6,091,292 | * 7/2000 | Higashiyama et al. .......... 330/207 A |

FOREIGN PATENT DOCUMENTS

| | | |
|---|---|---|
| 0 199 381 A1 | 10/1986 | (EP) . |
| 2 179 793 A1 | 11/1973 | (FR) . |
| 59 153 309 A1 | 9/1984 | (JP) . |

* cited by examiner

*Primary Examiner*—Benny Lee
*Assistant Examiner*—Khanh Van Nguyen
(74) *Attorney, Agent, or Firm*—Sughrue, Mion, Zinn, Macpeak & Seas, PLLC

(57) ABSTRACT

Amplifier of the G class type, comprising at least one set of two transistor pairs (1,2; 3,4) having together four transistors (11 to 14; 19 to 22) of the same conductivity type with an input electrode, a common electrode and an output electrode, each pair (1,2; 4,3) comprising an input transistor (11,13; 19,21) and an output transistor (12,14; 20,22) in cascade, the output electrode of the input transistor (11,13; 19,21) being coupled to the input electrode of the output transistor (12,14; 20,22), whereby further means (5) are provided for applying an input signal to the input electrodes of the input transistors (11,13; 19,21) of both pairs and both pairs (1,2; 3,4) are biased by two different voltage supplies (6,7; 8,9), control means being provided for switching over from the voltage of one voltage supply (6; 8) to the voltage of the other voltage supply (7; 9), the transistors (11 and 12; 19 and 20) of the first pair (1; 4) of a set being connected in a Darlington circuit arrangement while both transistors (13 and 14; 21 and 22) of the second pair (2; 3) have their common electrodes separated from each other, the common electrode of the input transistor (13 or 21) of the second pair (2 or 3) being coupled to the output electrode of the input transistor (11; 19) of the first pair (1; 4) and the common electrode of the output transistor (14; 22) of the second pair (2; 3) being coupled to the output electrode of the output transistor (12; 20) of the first pair (1; 4).

10 Claims, 1 Drawing Sheet

POWER AMPLIFIER ARRANGEMENT

BACKGROUND OF THE INVENTION

The invention relates to a power amplifier arrangement with high current drive capability, particularly but not exclusively for transmission systems.

In several transmission systems, such as Asymmetric Digital Subscriber Line, video distribution and audio, there is a need to transmit signals with high crest factors (peak/rms). This high crest factor results from short signal peaks that rarely occur, but which force the driver to be supplied from a high voltage supply. This results in a high dynamic power consumption in the amplifier.

In the seventies amplifiers were developed with lower power consumption, more particularly the class G amplifiers working at two different supply voltages. They use one large output stage, biased by two different voltage supplies, whereby diodes are generally used to control the switchover from the low voltage to the high voltage supply. Such G class transistor amplifiers are amongst others disclosed in U.S. Pat. No. 3,772,606 and U.S. Pat. No. 4,100,501.

In case the transistors of the classical G class amplifiers have to drive large currents, they may be replaced by Darlington pairs, such as for instance disclosed in the above-mentioned U.S. Pat No. 4,100,501. In this prior art document, the described push-pull variant comprises two Darlington pairs having together four transistors of the same conductivity type and two Darlington pairs having together four transistors of the conductivity type opposite to that of the first mentioned Darlington pairs. The transistors of the first and second Darlington pairs conduct during each positive half cycle of the input signal. The transistors of the third and fourth Darlington pairs conduct during each negative half cycle of the signal. The collectors of the two transistors of a first Darlington pair are connected to each other and to a positive D.C. high voltage supply. Similarly, the collectors of the two transistors of a fourth Darlington pair are connected to each other and to a negative D.C. high voltage supply. In this prior art embodiment the collectors of the two transistors of the second Darlington pair are also connected to each other and via a diode to a positive D.C. low voltage supply, while the two transistors of the third Darlington pair are connected to each other and via another diode to a negative D.C. low voltage supply. The emitter of the output transistor of the first, respectively fourth, Darlington pair is coupled to the collectors of both transistors of the second, respectively third, Darlington pair.

This prior art solution whereby each transistor of the original class-G amplifier is replaced by a Darlington pair, results in a high current amplification and consequently a high current drive capability, but at the same time in a large voltage drop across all Darlington pairs.

The invention seeks to provide an amplifier with high current drive capability with relatively low dynamic power consumption, but avoiding such a large voltage drop across the transistors.

SUMMARY OF THE INVENTION

In accordance with the invention, this object is accomplished in an amplifier of the G class type, comprising at least one set of two transistor pairs having together four transistors of the same conductivity type with an input electrode, a common electrode and an output electrode, each pair comprising an input transistor and an output transistor in cascade, the output electrode of the input transistor being coupled to the input electrode of the output transistor, whereby means are provided for applying an input signal to the input electrodes of the input transistors of both pairs and both pairs are biased by two different voltage supplies, control means being provided for switching over from the voltage of one voltage supply to the voltage of the other voltage supply, the transistors of the first pair of a set being coupled in a Darlington circuit arrangement, characterized in that both transistors of the second pair of said set have their common electrodes separated from each other, the common electrode of the input transistor of said second pair being coupled to the output electrode of the input transistor of the first pair and the common electrode of the output transistor of said second pair being coupled to the output electrode of the output transistor of the first pair.

By disconnecting from each other the common terminals of the transistors of the second pair and by putting in series the input transistors of both pairs, the voltage drop is reduced and the dynamic range of the amplifier at the lower supply voltage is increased. This can in turn result in a lower value of this lower supply voltage, which again results in a lower power consumption, being the main benefit of the invention.

Remark that in the claims and throughout this document, the expression "common electrode" is to be interpreted with reference to the configuration of the circuit of which the transistor having this common electrode forms part. In this respect, as is described in all standard electronics handbooks, the common electrode is common to both the input and the output circuit, as opposed to either the input or the output electrodes themselves. This common electrode, corresponds to the "common" or ground from ac point of view.

The input electrode of the transistors may be the base, the common electrode the collector and the output electrode the emitter, as described by claim 2.

In such case, the collectors of both transistors of the first pair of a set are coupled to a first D.C. voltage supply, the emitter of the output transistor of the first pair and the collector of the output transistor of the second pair of the set are coupled to each other and to a second D.C. voltage supply with a voltage which is in absolute valuelower than the voltage provided by the first voltage supply, the means for applying an input signal being coupled to the bases of the input transistors of both pairs, and the collector of the input transistor of the second pair being coupled to the emitter of the input transistor of the first pair and thus disconnected from the collector of the output transistor of the second pair and thus also disconnected from the emitter of the output transistor of the first pair.

In addition, a drive control circuit coupled between the means for applying an input signal, and the input terminals of the transistor pairs, may comprise diodes coupled between the input transistors of the two pairs and the means for applying this input signal, as is described in claims 3 and 4.

The control means for switching over from one voltage to the other can include a diode in a connection between the second lower D.C. voltage supply, on the one hand, and the output electrode of the output transistor of the first pair and the common electrode of the output transistor of the second pair, on the other hand.

The control means for switching over from one voltage to the other may also include a diode in a connection between the second lower D.C. voltage supply, on the one hand, and the output electrode of the input transistor of the first pair and the input electrode of the output transistor of the first pair, on the other hand.

The means for applying an input signal may include an A.C. input signal source, this signal being a current or a voltage, in which case the amplifier contains two sets of two transistor pairs, one set for the positive half cycle of the input signal and one set for the negative half cycle of the input signal, whereby the transistors of the second set are of the opposite conductivity type to that of the transistors of the first set and the two voltage supplies for the second set are of a polarity opposite to the polarity of the voltage supplies for the first set.

In this case, the amplifier may more particularly comprise a second set with third and fourth pairs similar to the second and first pairs of the first set, whereby thus the emitter of the input transistor of the fourth pair, which is a Darlington pair, is coupled to the base of the output transistor of this fourth pair and coupled to the collector of the input transistor of the third pair. The collectors of both transistors of the third pair are thereby again disconnected from each other. The collectors of both transistors of the fourth pair are coupled to a third D.C. voltage supply whereby the emitter of the output transistor of the fourth pair and the collector of the output transistor of the third pair are coupled to each other and to a fourth D.C. voltage supply providing a voltage which is lower in absolute value than the voltage provided by third D.C. voltage supply, and whereby further the bases of the input transistors of the third and fourth pairs are coupled to the means for applying an input signal and the emitter of the output transistor of the third pair is coupled to the emitter of the output transistor of the second pair.

BRIEF DESCRIPTION OF THE DRAWINGS

The invention will now be described by way of example and with reference to the accompanying drawing which is a schematic circuit diagram of an amplifier according to the invention.

DETAILED DESCRIPTION OF THE INVENTION

Figure 1:
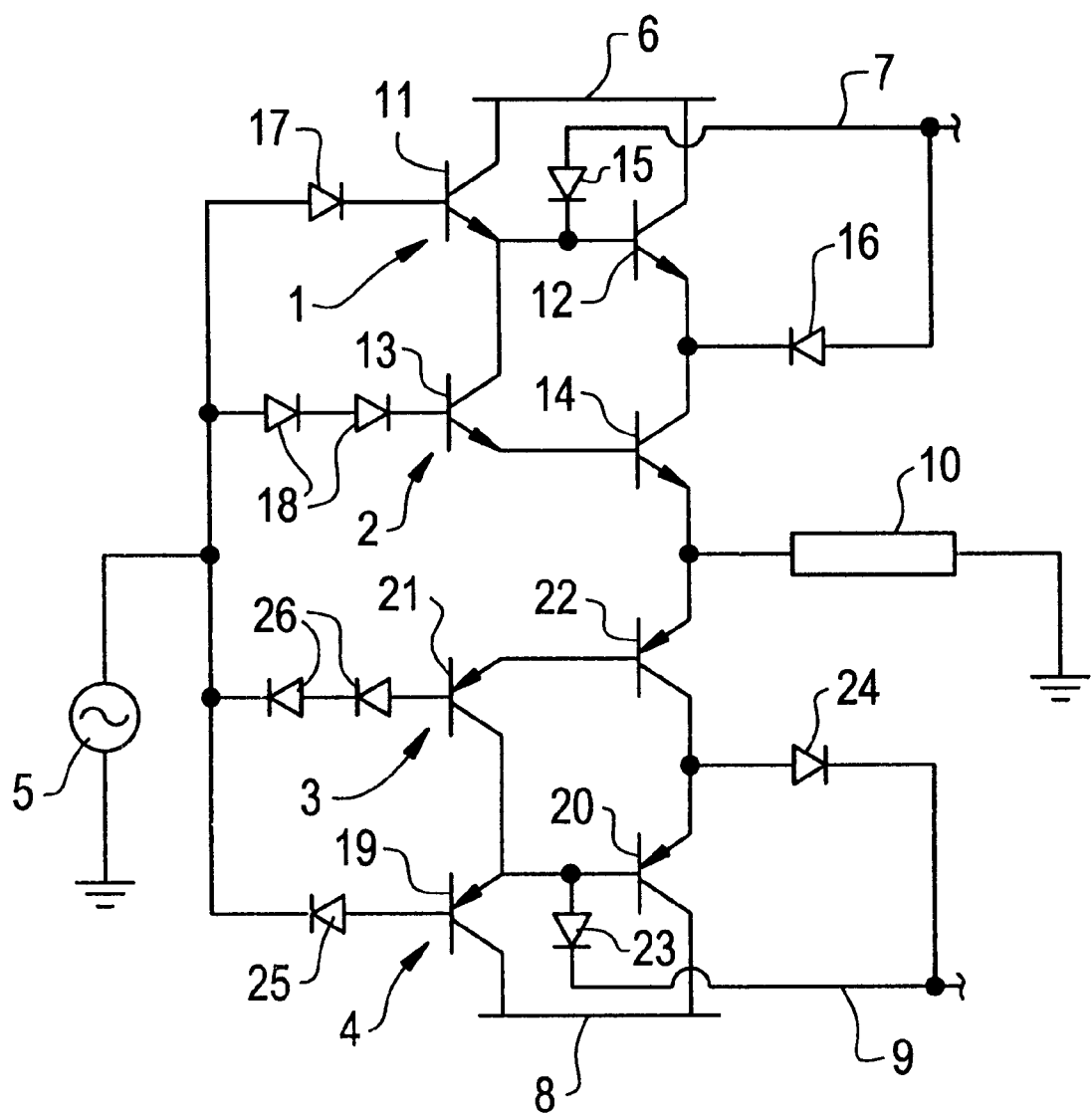

The amplifier circuit represented in the drawing is a G class amplifier comprising essentially a first set of two transistor pairs 1 and 2, a second set of two transistor pairs 3 and 4, an A.C. input signal source 5, a first, positive high D.C. voltage supply 6, a second, positive low D.C. voltage supply 7, a third, negative high D.C. voltage supply 8 and a fourth, negative low D.C. voltage supply 9. The output terminal of the second transistor pair, coupled to the output terminal of the third transistor pair constitutes an output terminal of this amplifier circuit, which is in general coupled to a load 10.

The first transistor pair 1 consists of an input transistor 11 and an output transistor 12 coupled in Darlington circuit arrangement, and is thus what is called a Darlington pair, whereby consequently the emitter of transistor 11 is coupled to the base of transistor 12 and the collectors of both transistors 11 and 12 are coupled to each other and to the first D.C. voltage supply 6.

The second transistor pair 2 consists of an input transistor 13 and an output transistor 14, whereby the emitter of transistor 13 is coupled to the base of transistor 14. However, the collectors of both transistors 13 and 14 are not coupled to each other and this second pair 2 is therefore not a Darlington pair.

All transistors 11 to 14 are of the same conductivity type, in the illustrated example of NPN type.

The second, low voltage supply 7 is coupled through a diode 15 to the junction between the emitter of transistor 11 and the base of transistor 12. The diode 15 avoids that the transistor 12 receives a reverse voltage, while at the same time also assuring the switchover from the current from the second D.C. voltage supply 7 to the first voltage supply 6 when the input signal exceeds a certain level which is related to the voltage provided by the second voltage supply 7.

The collector of the output transistor 14 of the second pair 2 is coupled to the emitter of the output transistor 12 of the first pair 1 by means of a junction to which the second lower voltage supply 7 is also coupled through another diode 16. This emitter of the output transistor 12 is not coupled to the collector of the input transistor 13 of the second pair 2.

The emitter of the input transistor 11 of the first pair 1 is coupled to the collector of the input transistor 13 of the second pair 2.

To the emitter of transistor 14 of the second pair 2 one terminal of the load 10 may be coupled, the other terminal of the load being grounded.

The base of the input transistor 11 is coupled to one terminal of the A.C. input signal source 5 through a diode 17, while the base of the input transistor 13 is also coupled to this terminal but through two series-coupled diodes 18. The other terminal of the source 5 is grounded.

The diodes 17 and 18, forming part of the drive control circuit, assure a difference in drive voltage to the transistors 11 and 12, but it is obvious that this voltage difference may be obtained by other means than said diodes 17 and 18. Thus other embodiments of such a drive control circuit exist, and are commonly known by a person skilled in the art.

The third and fourth transistor pairs 3 and 4 are respectively similar to the above mentioned second and first transistor pairs 2 and 1, with this difference that their transistors 19, 20, 21 and 22 are all of a same conductivity type which is however of the opposite type to that of transistors 11, 12, 13 and 14 and are consequently of the PNP type in the illustrated example.

The fourth transistor pair 4 is similar to the first pair 1 and forms the first pair of the second set of pairs. This fourth pair 4 consists of an input transistor 19 and an output transistor 20 coupled in a Darlington circuit arrangement. The emitter of transistor 19 is coupled to the base of transistor 20 whereas the junction point is coupled through a diode 23 to the fourth, negative low D.C. voltage supply 9, while the collectors of both transistors 19 and 20 are coupled to the third negative high D.C. voltage supply 8.

In a lot of embodiments, except for the sign, the higher voltages of the supplies 6 and 8 are equal in value, while the lower voltages of the supplies 7 and 9 are also equal in value but of opposite sign. However in other embodiments asymmetrical voltage values can be the case. In the most general case the first supply voltage is more positive than the third supply voltage, the second supply voltage is more positive than the fourth one, the difference between the first and the third is larger than the difference between the second and the fourth supply voltage, and the voltages between the second and fourth supply voltage, are lying within the range of voltages between the first and the third supply voltage.

The third pair 3 is similar to the second pair 2. It forms the second pair of the second set of pairs and consists of an input transistor 21 and an output transistor 22. The emitter of transistor 21 is coupled to the base of transistor 22. The collector of the input transistor 21 is coupled to the emitter of the input transistor 19 of the fourth pair 4 but is not coupled from the emitter of the output transistor 20 of this fourth pair 4, while the collector of the output transistor 22 is coupled to the emitter of the output transistor 20, the junction being coupled through a diode 24 to said fourth negative low D.C. voltage supply 9.

The emitter of the output transistor 22 of the third pair 3 is coupled to the output terminal, which is further coupled to the load 10.

The bases of the input transistors 19 and 21 are coupled through a diode 25, respectively through a series-connection of diodes 26 with the A.C. input signal source 5.

The set of transistor pairs 3 and 4 operates as a complementary circuit to the set of transistor pairs 1 and 2. The transistors 11 and 13 conduct during each positive half cycle of the input signal. The transistors 19 and 21 conduct during each negative half cycle of the signal, a push-pull mode of operation being carried out.

Output signals from the input transistors 11, 13, 19 and 21 are fed to the output transistors 12, 14, 19 and 22, respectively, where they are further amplified and fed to the load 10.

The amplifier further operates as a G class amplifier, the pairs 1,2 and 3,4 of both sets being biased by two different voltages.

Important is that, due to the fact that the collectors of the transistor 13 and 14 of the second pair 2 are not in contact with each other, the emitter of the output transistor 12 of the first pair 1 is not coupled to the collector of the input transistor 13 of the second pair 2, this collector being coupled to the emitter of the input transistor 11 of the first pair 1. Consequently, the transistor 13 receives a higher voltage. Thus transistor 13 will be able to drive transistor 14 with a higher voltage, thereby reducing the voltage drop over transistor 14 since the emitter of transistor 14 will be as well driven at a higher voltage while the collector voltage is kept at the second low voltage supply via the diode 16 in case the output current is supplied by the second D.C. supply voltage.

The same applies to the transistors 21 and 22 of the third pair 3. The collectors of these transistors 21 and 22 are not coupled to each other and the emitter of the output transistor 20 of the fourth pair 4 is coupled to the collector of the output transistor 22 of the third pair 3 but not to the collector of the input transistor 21 of this third pair 3. The emitter of the input transistor 19 of the fourth pair 4 is coupled to the collector of the input transistor 21.

The dynamic range of the amplifier at the supply voltage of the low voltage supply 7 or 9 is increased and this low supply voltage may be lower.

What is claimed is:

1. Amplifier of the G class type, comprising at least one set of two transistor pairs (1,2; 3,4) having together four transistors (11 to 14; 19 to 22) of the same conductivity type with an input electrode, a common electrode and an output electrode, each pair (1,2; 4,3) comprising an input transistor (11,13; 19,21) and an output transistor (12,14; 20,22) in cascade, the output electrode of the input transistor (11,13; 19,21) being coupled to the input electrode of the output transistor (12,14; 20,22), whereby means (5) are provided for applying an input signal to the input electrodes of the input transistors (11,13; 19,21) of both pairs and both pairs (1,2; 3,4) are biased by two different voltage supplies (6,7; 8,9), whereby control means is provided for switching over from the voltage of one voltage supply (6; 8) to the voltage of the other voltage supply (7; 9), the transistors (11 and 12; 19 and 20) of the first pair (1; 4) of a set are connected in a Darlington circuit arrangement characterized in that both transistors (13 and 14; 21 and 22) of the second pair (2; 3) of said set have their common electrodes separated from each other, the common electrode of the input transistor (13 or 21) of said second pair (2 or 3) being coupled to the output electrode of the input transistor (11; 19) of said first pair (1; 4) and the common electrode of the output transistor (14; 22) of said second pair (2; 3) being coupled to the output electrode of the output transistor (12; 20) of said first pair (1; 4).

2. Amplifier according to claim 1, characterized in that the collectors of both transistors (11 and 12) of said first pair (1; 4) of said set are coupled to a first D.C. voltage supply (6; 8), the emitter of the output transistor (12; 20) of said first pair (1; 4) and the collector of the output transistor (14; 22) of said second pair (2; 3) are coupled to each other and to a second D.C. voltage supply (7; 9) providing a voltage which is lower in absolute value than the first voltage supply (6; 8), said means (5) for applying an input signal being coupled to the bases of the input transistors (11 and 13; 19 and 21) of both pairs (1 and 2; 3 and 4), and the collector of the input transistor (13; 21) of said second pair (2; 3) being coupled to the emitter of the input transistor (11; 19) of said first pair (1; 4).

3. Amplifier according to claim 1, characterized in that said amplifier further includes a drive control circuit coupled between said means for applying an input signal, and said input electrodes of said input transistors of said pairs.

4. Amplifier according to claim 3, characterized in that said drive control circuit includes diodes (17,18; 25,26) coupled between said means (5) for applying an input signal and between said input transistors (11,13; 19,21) of the two pairs (1,2; 4,3).

5. Amplifier according to claim 1, characterized in that said control means for switching over from one voltage to the other includes a diode (16; 24), in a connection between said second D.C. voltage supply (7; 9), on one hand, and between the output electrode of the output transistor (12; 20) of said first pair (1; 4) and to the common electrode of the output transistor (14; 22) of said second pair (2; 3), on the other hand.

6. Amplifier according to claim 1, characterized in that said control means for switching over from one voltage to the other includes a diode (15; 23), in a connection between said second D.C. voltage supply (7; 9), on the one hand, and the output electrode of the input transistor (11; 19) of said first pair (1; 4) and the input electrode of the output transistor (12; 20) of said first pair (1; 4), on the other hand.

7. Amplifier according to claim 1, characterized in that said means for applying an input signal includes an A.C. input signal source (5),
said amplifier includes two sets of two transistor pairs (1,2 and 3,4), a first set (1,2) for the positive half cycle of said input signal and a second set (3,4) for the negative half cycle of the input signal, whereby the transistors (19 to 22) of said second set are (3,4) of the opposite conductivity type to that of the transistors (11 to 14) of said first set (1,2) and the two voltage supplies (8, 9) for the second set (3,4) are of a polarity opposite to the polarity of the two voltage supplies (6, 7) for said first set (1,2).

8. Amplifier according to claim 7, characterized in that third and fourth transistor pairs (3 and 4) of said second set for the negative half cycle of the input signal, are similar to the second and first pairs (2, 1) of said first set, whereby the emitter of the input transistor (19) of said fourth pair (4), being a Darlington pair, is coupled to the base of the output transistor (20) of said fourth pair (4) and coupled to the collector of the input transistor (21) of said third pair (3), whereby the collectors of both transistors of said fourth pair (4) are coupled to a third D.C. voltage supply (8), whereby the emitter of the output transistor (20) of said fourth pair (4) and the collector of the output transistor (22) of said third pair (3) are coupled to each other and to a fourth D.C. voltage supply (9) providing a voltage which is lower in absolute value than the voltage provided by said third D.C. voltage supply (8), whereby the bases of the input transistors (21,19) of said third and said fourth pairs (3 and 4) are coupled to said means (5) for applying an input signal, and whereby the emitter of the output transistor (22) of said third pair (3) is coupled to the emitter of the output transistor (14) of said second pair (2).

9. Amplifier according to either claim 7, characterized in that said control means for switching over from one voltage to the other further includes a diode (24) in a connection between said fourth D.C. voltage supply (9), on the one hand, and the output electrode of the output transistor (20) of said fourth pair (4) and the common electrode of the output transistor (22) of said third pair (3), on the other hand.

10. Amplifier according to either one of claims 7, characterized in that said control means for switching over from one voltage to the other further includes a diode (23) in a connection between said fourth D.C, voltage supply (9), on the one hand, and the output electrode of the input transistor (19) of said fourth pair (4) and the input electrode of the output transistor (20) of said fourth pair (4), on the other hand.

* * * * *